(12) United States Patent
Brown et al.

(10) Patent No.: US 10,593,835 B2
(45) Date of Patent: Mar. 17, 2020

(54) ELECTRONIC DEVICE CONTACT STRUCTURES

(71) Applicant: Luminus Devices, Inc., Woburn, MA (US)

(72) Inventors: Michael Gregory Brown, Tyngsboro, MA (US); Yves Bertic, Cambridge, MA (US); Scott W. Duncan, Andover, MA (US); Hong Lu, Wayland, MA (US); Ravi Rajan, Wakefield, MA (US); John Woodhouse, Lexington, MA (US); Feng Yun, Westford, MA (US); Hao Zhu, Tewksbury, MA (US)

(73) Assignee: Luminus Devices, Inc., Woburn, MA (US)

( * ) Notice: Subject to any disclaimer, the term of this patent is extended or adjusted under 35 U.S.C. 154(b) by 0 days.

(21) Appl. No.: 15/604,095

(22) Filed: May 24, 2017

(65) Prior Publication Data

US 2018/0076357 A1 Mar. 15, 2018

Related U.S. Application Data

(63) Continuation of application No. 14/496,386, filed on Sep. 25, 2014, now abandoned, which is a continuation of application No. 13/447,731, filed on Apr. 16, 2012, now Pat. No. 8,872,217.

(60) Provisional application No. 61/475,715, filed on Apr. 15, 2011.

(51) Int. Cl.
*H01L 33/00* (2010.01)
*H01L 33/38* (2010.01)
*H01L 33/62* (2010.01)

(52) U.S. Cl.
CPC .............. *H01L 33/38* (2013.01); *H01L 33/62* (2013.01)

(58) Field of Classification Search
CPC .................................. H01L 33/38; H01L 33/62
See application file for complete search history.

(56) References Cited

U.S. PATENT DOCUMENTS

| 5,955,749 A | 9/1999 | Joannopoulos et al. |
|---|---|---|
| 6,614,056 B1 | 9/2003 | Tarsa et al. |
| 6,831,302 B2 | 12/2004 | Erchak et al. |
| 7,105,861 B2 | 9/2006 | Erchak et al. |
| 7,166,871 B2 | 1/2007 | Erchak |
| 7,170,100 B2 | 1/2007 | Erchak et al. |
| 7,344,279 B2 | 3/2008 | Mueller et al. |
| 7,391,059 B2 | 6/2008 | Erchak et al. |
| 7,482,640 B2 | 1/2009 | Erchak et al. |
| 7,521,854 B2 | 4/2009 | Erchak |
| 7,598,531 B2 | 10/2009 | Erchak et al. |
| D606,021 S | 12/2009 | Panaccione et al. |
| 7,692,207 B2 | 4/2010 | Erchak et al. |
| 7,772,486 B2 * | 8/2010 | Nakashima ..... H01L 31/022425 136/252 |
| 7,993,940 B2 | 8/2011 | Pumyea et al. |
| 8,643,266 B2 | 2/2014 | Pumyea et al. |
| 8,872,217 B2 * | 10/2014 | Brown .................... H01L 33/62 257/100 |

(Continued)

*Primary Examiner* — Frederick B Hargrove
(74) *Attorney, Agent, or Firm* — Wolf, Greenfield & Sacks, P.C.

(57) ABSTRACT

Electronic devices involving contact structures, and related components, systems and methods associated therewith are described. The contact structures are particularly suitable for use in a variety of light-emitting devices, including LEDs.

7 Claims, 9 Drawing Sheets

(56) References Cited

U.S. PATENT DOCUMENTS

| | | |
|---|---|---|
| 2004/0079942 A1 | 4/2004 | Steranka et al. |
| 2005/0051785 A1* | 3/2005 | Erchak .................. B82Y 20/00 257/98 |
| 2005/0082545 A1 | 4/2005 | Wierer, Jr. et al. |
| 2005/0087753 A1 | 4/2005 | D'Evelyn et al. |
| 2006/0043400 A1* | 3/2006 | Erchak .................. H01L 33/20 257/98 |
| 2006/0118799 A1 | 6/2006 | D'Evelyn et al. |
| 2007/0114636 A1 | 5/2007 | Erchak et al. |
| 2008/0211416 A1 | 9/2008 | Negley et al. |
| 2011/0069729 A1 | 3/2011 | Strettmatter et al. |
| 2011/0210345 A1 | 9/2011 | Lim et al. |
| 2011/0303926 A1 | 12/2011 | Erchak et al. |
| 2015/0207036 A1 | 7/2015 | Brown et al. |

* cited by examiner

ELECTRONIC DEVICE CONTACT STRUCTURES

RELATED APPLICATIONS

This application is a continuation of U.S. application Ser. No. 14/496,386, filed Sep. 25, 2014, which is a continuation of U.S. application Ser. No. 13/447,731 (now U.S. Pat. No. 8,872,217), filed Apr. 16, 2012, which claims priority under 35 U.S.C. § 119(e) to U.S. Provisional Patent Application Ser. No. 61/475,715, filed Apr. 15, 2011, which are incorporated herein by reference in their entirety for all purposes.

TECHNICAL FIELD

The present invention relates to electronic devices, and related components, systems, and methods, and, more specifically, to light-emitting devices (e.g., LEDs) involving contact structures.

BACKGROUND

A light-emitting diode (LED) often can provide light in a more efficient manner than an incandescent light source and/or a fluorescent light source. The relatively high power efficiency associated with LEDs has created an interest in using LEDs to displace conventional light sources in a variety of lighting applications. For example, in some instances LEDs are being used as traffic lights and to illuminate cell phone keypads and displays.

Typically, an LED is formed of multiple layers, with at least some of the layers being formed of different materials. In general, the materials and thicknesses selected for the layers determine the wavelength(s) of light emitted by the LED. In addition, the chemical composition of the layers can be selected to try to isolate injected electrical charge carriers into regions (commonly referred to as quantum wells) for relatively efficient conversion to optical power. Generally, the layers on one side of the junction where a quantum well is grown are doped with donor atoms that result in high electron concentration (such layers are commonly referred to as n-type layers), and the layers on the opposite side are doped with acceptor atoms that result in a relatively high hole concentration (such layers are commonly referred to as p-type layers).

LEDs also include contact structures (also referred to as electrical contact structures or electrodes), which are features on a device that are electrically connected to a power source. The power source can provide current to the device via the contact structures, e.g., the contact structures can deliver current along the lengths of structures to the surface of the device where energy can be converted into light.

In some devices, problems may arise when the contact structures do not spread current uniformly across the surface of the device. This can lead to undesirable effects such as non-uniform light emission across the device, decreased light output, overheating, and performance degradation.

Contact structures that would, for example, minimize these effects in LEDs would find application in a number of different fields.

SUMMARY

Light-emitting devices, and related components, systems, and methods associated therewith are provided.

In one set of embodiments, a light-emitting device is provided. In certain embodiments, the light-emitting device comprises an emission surface bound by a periphery; a first electrically conductive pad portion disposed along a first portion of the periphery of the emission surface; a second electrically conductive pad portion disposed along a second portion of the periphery of the emission surface; a bus bar connecting the first and second electrically conductive pad portions; and a plurality of electrically conductive contact members connected to and extending outward from the bus bar.

In some embodiments, the light-emitting device comprises an emission surface bound by a periphery; a first electrically conductive pad portion disposed along a first portion of the periphery of the emission surface; a second electrically conductive pad portion disposed along a second portion of the periphery of the emission surface and opposed to the first electrically conductive pad portion; a third electrically conductive pad portion disposed along a third portion of the periphery of the emission surface; and a fourth electrically conductive pad portion disposed along a fourth portion of the periphery of the emission surface and opposed to the third electrically conductive pad portion. In certain embodiments, the light-emitting device comprises a plurality of electrically conductive contact members connecting the first and third electrically conductive pad portions; and a plurality of electrically conductive contact members connecting the second and fourth electrically conductive pad portions. In some embodiments, the electrically conductive contact members have first ends and second ends defining lengths of the electrically conductive contact members, and the lengths of the electrically conductive contact members are non-linear.

Other advantages, novel features, and objects of the invention will become apparent from the following detailed description of the invention when considered in conjunction with the accompanying drawings, which are schematic and which are not intended to be drawn to scale. In cases where the present specification and a document incorporated by reference include conflicting and/or inconsistent disclosure, the present specification shall control. If two or more documents incorporated by reference include conflicting and/or inconsistent disclosure with respect to each other, then the document having the later effective date shall control. In the figures, each identical or nearly identical component that is illustrated in various figures is represented by a single numeral. For purposes of clarity, not every component is labeled in every figure, nor is every component of each embodiment of the invention shown where illustration is not necessary to allow those of ordinary skill in the art to understand the invention.

DESCRIPTION

The present invention relates to electronic devices and related components, systems, and methods, and, more specifically, to electronic devices involving contact structures. Contact structures (also referred to as electrical contact structures or electrodes) are features on a device that are electrically connected to a power source. The power source can provide current to the device via the contact structures. The contact structures can be designed to improve current distribution in electronic devices. For example, in some embodiments, multiple electrically conductive pads can be sized and/or strategically positioned on the face of the light-emitting device to improve current distribution. In some embodiments, the contact resistance of the contact members may be modified to improve current distribution (e.g., by controlling the shape and/or structure and/or composition of the contact members). The contact structures may include an intervening layer (e.g., a non-ohmic layer) positioned between a surface of the device and an electrically conductive portion extending from an electrically conductive pad. As described further below, the intervening layer and/or electrically conductive portions may be designed to have certain shapes that promote current flow from the conductive pad towards the middle of the light-emitting device to increase current spreading. Advantageously, devices including contact structures of the invention can increase uniformity of light emission and/or otherwise improve performance. As such, these contact structures are particularly suitable for use in a variety of light-emitting devices, including LEDs.

Although the primary description below involves contact structures in relation to LEDs, it is to be understood that contact structures of the invention can be used, e.g., to spread current and/or to improve performance, in other electronic devices, including both LED and non-LED light-emitting devices.

Figure 1A:
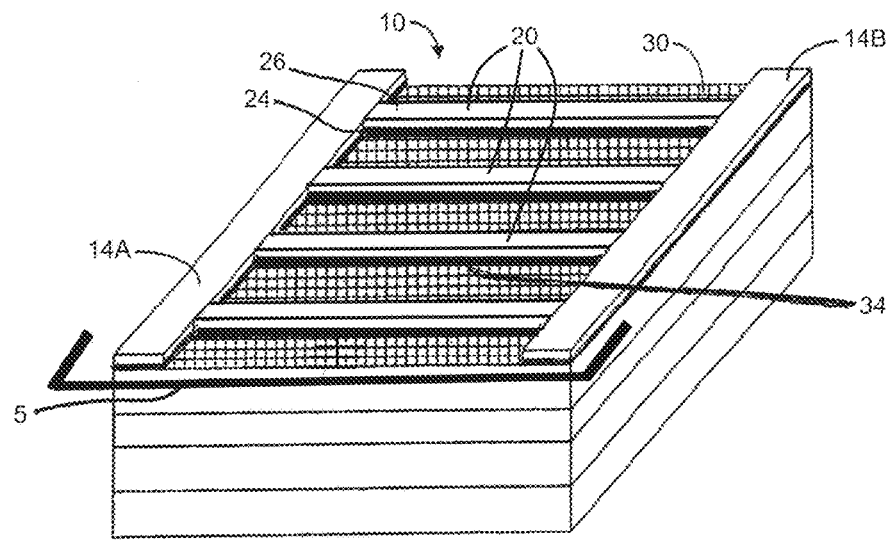
FIGS. 1A and 1B show a device including a contact structure according to one embodiment of the invention.
Figure 1B:
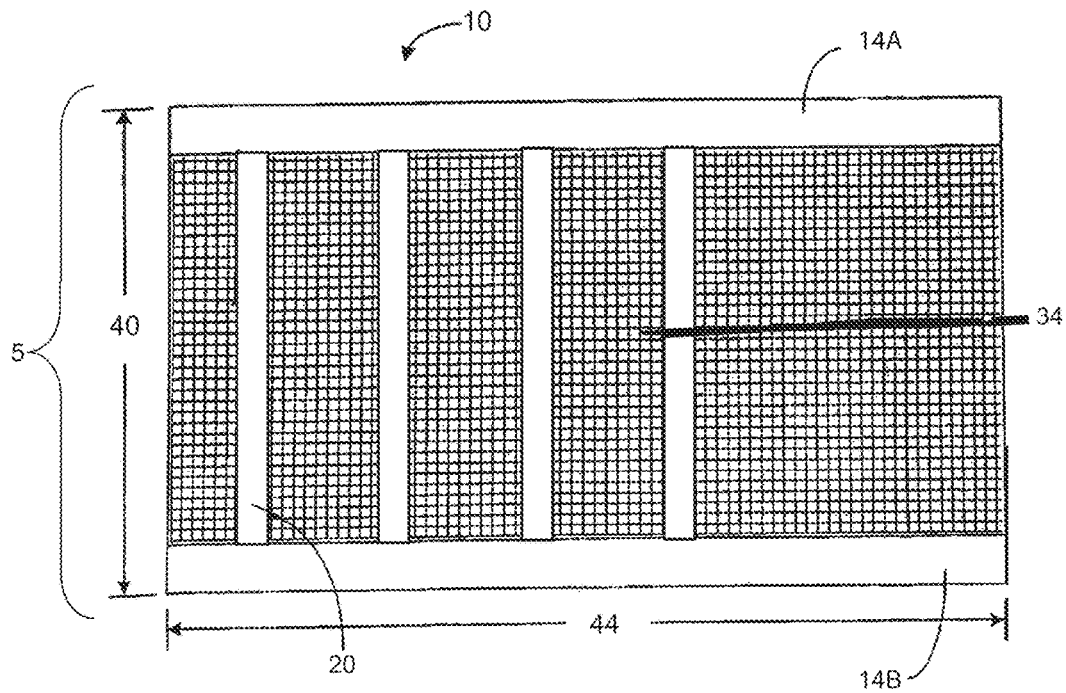

FIGS. 1A and 1B show contact structure 5 of LED 10 according to one embodiment of the invention. It should be understood that the contact structure in FIGS. 1A-1B is shown schematically to illustrate the general location and function of a contact structure in the LED, and that other contact structures are possible including those illustrated below. In this particular embodiment, the contact structures include two conductive pads 14A and 14B and contact members 20 extending from the conductive pads. The conductive pads and contact members are disposed along portions of the periphery of top surface 30 of the LED. The contact member may further be in contact with non-ohmic portion 24 positioned between a conductive portion 26 and the top surface of the LED. Conductive portions of the contact members can form ohmic contacts with the top surface of the LED. Wire bonds (not shown) connected to the conductive pads can provide current and voltage to the LED. The contact members can spread the current from the conductive pads to the top surface of the LED, e.g., away from the conductive pads and/or towards central region 34. In some embodiments, the non-ohmic portion and/or the conductive portion of a contact member may have a shape that can promote current spreading, amongst other advantages, as described in more detail below.

Figure 2:
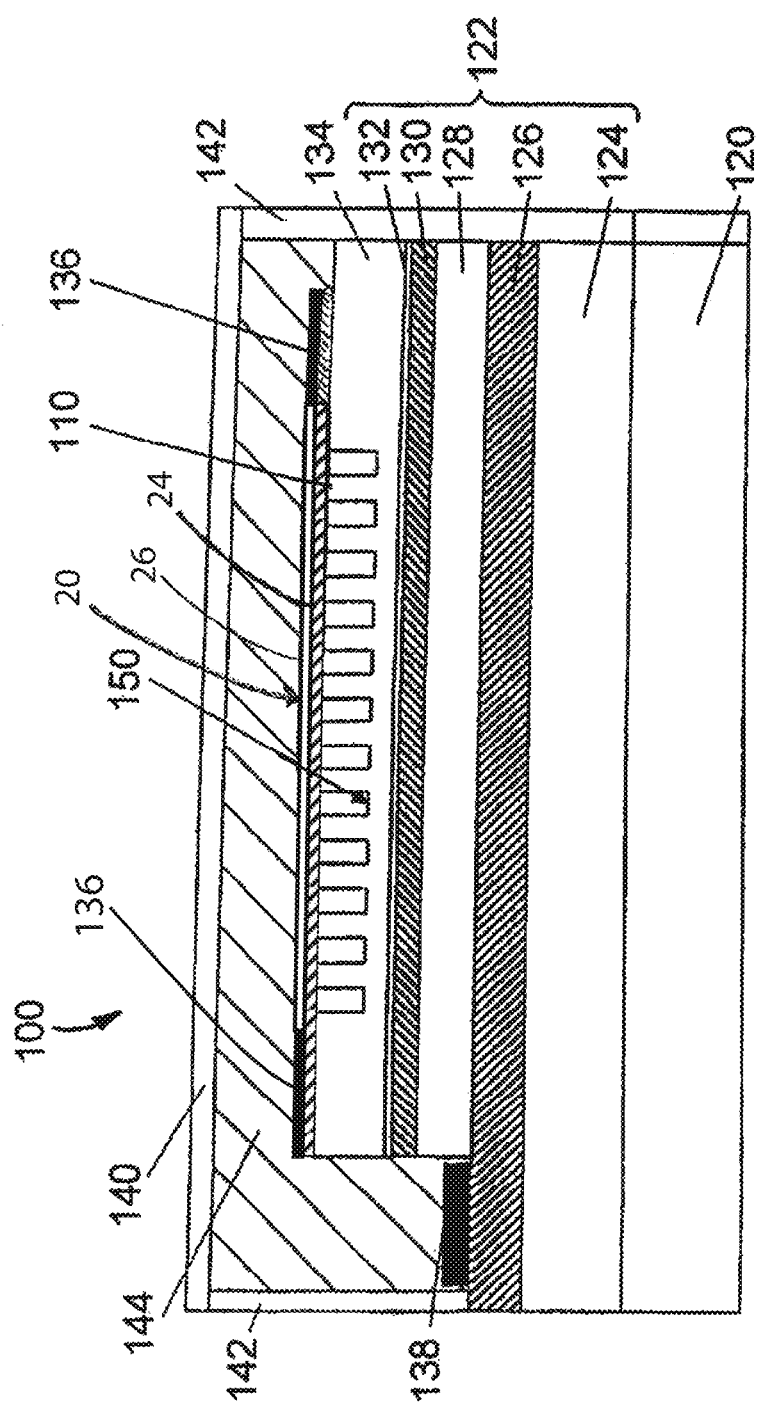
FIG. 2 shows a side view of an LED according to an embodiment of the invention.

FIG. 2 shows a side view of LED 100 including contact members 20 in the form of a packaged die. LED 100 includes a material body, which includes multi-layer stack 122 disposed on a submount 120. Multi-layer stack may include a silicon doped (n-doped) GaN layer 134, which may have a thickness of, e.g., 320 nm. The silicon doped layer can have a pattern of openings 150 in its upper surface 110. The openings can lead to a surface that has a dielectric function that varies spatially according to a pattern, as described further below. The multi-layer stack can also include bonding layer 124, reflective layer 126 (e.g., 100 nm thick comprising silver or an alloy thereof), magnesium doped (p-doped) GaN layer 128 (e.g., 40 nm thick), light-generating region 130 (e.g., 120 nm thick), which can be formed of multiple InGaN/GaN quantum wells, and AlGaN layer 132. N-side conductive pads 136 can be positioned on the silicon doped GaN layer, and a p-side conductive pad 138 can be positioned on the reflective layer. Contact members 20 can extend from conductive pads 136. In some embodiments, encapsulant material 144 (e.g., epoxy having an index of refraction of 1.5) can optionally be present between the silicon doped GaN layer, cover slip 140, and supports 142, although such a material is not required. The encapsulant material may extend into the openings of the upper surface; however, in some embodiments, the encapsulant material does not extend into the openings.

It should be understood that various other modifications can be made to the representative LED structures presented, and that the invention is not limited in this respect. For example, the n-doped and p-doped sides may be interchanged so as to form an LED having a p-doped region in contact with the conductive pad 136 and an n-doped region in contact with the conductive pad 138.

Light can be generated by LED 100 as follows. P-side conductive pad 138 may be held at a positive potential relative to n-side conductive pads 136, which causes electrical current to be injected into the LED. As the electrical current passes through light-generating region 130, electrons from n-doped layer 134 can combine with holes from p-doped layer 128 in the light-generating region, which can cause formation of light. The light-generating region may contain a plurality of point dipole radiation sources that emit light (e.g., isotropically) within the region with a spectrum of wavelengths characteristic of the material from which the light-generating region is formed. For a light-generating region including InGaN/GaN quantum wells, the spectrum of wavelengths of light generated by the region can have a peak wavelength of about 460 nanometers (nm) and a full width at half maximum (FWHM) between 20 and 50 nm. In one embodiment, the spectrum of wavelengths generated has a FWHM of about 30 nm.

It is to be noted that the charge carriers in the p-doped layer 128 have relatively low mobility compared to the charge carriers in the n-doped semiconductor layer. As a result, placing the reflective layer, or any conductive layer such as a contact layer, along the surface of the p-doped layer can enhance the uniformity of charge injection from the p-side conductive pad into the p-doped layer and light-generating region. This can also reduce the electrical resistance of the device and/or increase the injection efficiency of the device. Because of the design of contact members 20 (discussed in more detail below), electrons can spread relatively quickly from the n-side conductive pad throughout the AlGaN and silicon doped GaN layers, e.g., so that the current density within the light-generating region is substantially uniform across the light-generating region. It is also to be noted that the reflective layer has relatively high thermal conductivity, allowing it to act as a heat sink for the LED (e.g., to transfer heat vertically from the multi-layer stack to the submount).

At least some of the light that is generated by the light-generating region may be directed toward the reflective layer. This light can be reflected by the reflective layer and can emerge from the LED via upper surface 110. Additionally and/or alternatively, light can be reflected by the reflective layer and then absorbed within the semiconductor material in the LED to produce an electron-hole pair that can combine in the light-generating region, causing the region to generate light. Similarly, at least some of the light that is generated by the light-generating region can be directed toward the n-side conductive pad. The underside of the n-side conductive pad can be formed of a material (e.g., a Ti/Al/Ni/Au alloy) that can reflect at least some of the light generated by the light-generating region. Accordingly, the light that is directed to the n-side conductive pad can be reflected by the pad and subsequently emerge from the LED via the upper surface (e.g., by being reflected from the reflective layer). Additionally and/or alternatively, the light that is directed to the n-side conductive pad can be reflected by the pad and may be absorbed within the semiconductor material in the LED to produce an electron-hole pair that can combine in the light-generating region, causing the region to generate light (e.g., with or without being reflected by the reflective layer).

In some embodiments, emission surface 110 of the LED has a dielectric function that varies spatially which can improve the extraction efficiency of light generated by the LED and may enable the high power levels described further below. For example, the dielectric function can vary spatially according to a pattern. The pattern may be periodic (e.g., having a simple repeat cell, or having a complex repeat super-cell), periodic with de-tuning, or non-periodic. Examples of non-periodic patterns include quasi-crystal patterns, for example, quasi-crystal patterns having 8-fold symmetry. In certain embodiments, the emission surface is patterned with openings which can form a photonic lattice. Suitable LEDs having a dielectric function that varies spatially (e.g., a photonic lattice) have been described in, for example, U.S. Pat. No. 6,831,302 B2, entitled "Light Emitting Devices with Improved Extraction Efficiency," filed on Nov. 26, 2003, which is incorporated herein by reference in its entirety.

In some embodiments, at least about 45% (e.g., at least about 50%, at least about 55%, at least about 60%, at least about 70%, at least about 80%, at least about 90%, at least about 95%) of the total amount of light generated by light-generating region 130 that emerges from LED 100 emerges via surface 110.

While certain semiconductor materials have been described in connection with the LED of FIG. 2, other semiconductor materials can also be used. In general, any semiconductor material suitable for use, e.g., in a light-emitting device, can be used. Non-limiting examples of semiconductor materials include materials from Groups 13-16 of the Periodic Table of Elements, organic semiconductor materials, and silicon. Examples of other light-generating materials include InGaAsP, AlInGaN, AlGaAs, and InGaAlP. Organic light-emitting materials include small molecules such as aluminum tris-8-hydroxyquinoline ($Alq_3$) and conjugated polymers such as poly[2-methoxy-5-(2-ethylhexyloxy)-1,4-vinylenephenylene] or MEH-PPV.

LEDs suitable for use in association with the present invention can emit light of any desired wavelength. In some embodiments, the emitted light may be red.

Materials used to form conductive and insulating portions can also vary, as described in more detail below.

In general, an LED can have any desired shape. Examples of such shapes include substantially square, substantially circular, substantially rectangular, substantially triangular, substantially trapezoidal, and substantially hexagonal. The dimensions of an LED can also vary.

In some embodiments, an LED may have a width and/or length ranging from about 0.5 mm to about 1 cm. For example, in some embodiments, the LED can have a width and/or a length of at least about 0.5 mm, at least about 1 mm, at least about 2 mm, at least about 5 mm, or between about 0.5 mm to about 1 cm, between about 1 mm and about 1 cm, or between about 2 mm and about 1 cm. In some embodiments, the surface area of the top surface of the LED (e.g., the emission surface such as emission surface 110 in FIG. 2) can be at least about 0.25 $mm^2$, at least about 1 $mm^2$, at least about 5 $mm^2$, at least about 10 $mm^2$, at least about 50 $mm^2$, or between about 0.25 $mm^2$ and about 100 $mm^2$, between about 1 $mm^2$ and about 100 $mm^2$, between about 5 $mm^2$ and about 100 $mm^2$, or between about 10 $mm^2$ and about 100 $mm^2$. In some embodiments, the contact structures described herein may be particularly effective when used in connection with large-sized LED's such as those having a width and/or a length of at least about 1 mm, or more. The width and length of square and rectangular light-emitting devices corresponds to the edge lengths of those devices. The width and length of a substantially circular light-emitting device both correspond to the diameter of the light-emitting device. One of ordinary skill in the art would be capable of determining the width and/or length of light-emitting devices of other shapes.

The aspect ratio (i.e., the ratio of a length to width of a structure) of an LED, or components of the LED, can also vary. For instance, an LED may have an aspect ratio of about 0.5 to 1, 1 to 2, or 2 to 3. In some embodiments, the aspect ratio of an LED may vary according to the dimensions of a display unit, e.g., the dimensions of the surface of the LED that emits light may be substantially similar to the dimensions of the surface of a display unit that is illuminated by the light emitted by LED. The aspect ratio of the display unit and/or the corresponding LED can be, for example, 1920×1080, 640×480, 800×600, 1024×700, 1024×768, 1024×720, 1280×720, 1280×768, 1280×960, or 1280×1064.

Referring back to FIG. 1B, LED 10 has width 40 and length 44, and includes conductive pads 14A and 14B, and contact members 20. In some embodiments, the width of a conductive pad can be larger than a width of a contact member. For example, in certain embodiments, the width of the contact pad(s) can be at least 2 times, at least 5 times, or at least 10 times (and/or up to 1000 times or up to 100 times) greater than the width of the contact member(s). The larger width of the conductive pads can allow the pads to function as power busses and spread a relatively large amount of power down the bus to the contact members. The widths of the conductive pads and contact members can be made relative to the size of the LED and/or can be based on other factors such as lithography and processing parameters. In some cases, the widths of the contact members can vary as a function of distance from the conductive pad, as discussed in more detail below.

Conductive pads can have any suitable dimension and/or shape. For instance, the length of a conductive pad can range from 50 μm to 500 μm (e.g., between 50 μm and 200 μm, between 200 μm and 350 μm, or between 350 μm and 500 μm). The width of a conductive pad can range, for example, from 1 μm to 50 μm (e.g., between 1 μm and 20 μm, between 20 μm and 30 μm, or between 30 μm and 50 μm). The height of the conductive pads can vary based on, for example, current and power to be supplied to the LED, or based on deposition and processing parameters. For example, the conductive pads can have a height ranging from 0.1 μm to 100 μm (e.g., between 0.1 μm and 1 μm, between 1 μm and 10 μm, or between 10 μm and 100 μm). For devices having two or more conductive pads, e.g., as shown in FIGS. 1A-1B, the conductive pads may have substantially similar dimensions. In other cases, one conductive pad may have dimensions that are substantially different from another conductive pad of the same device.

Conductive pads can be positioned in any suitable arrangement on a surface (e.g., a top surface) of an LED. In some cases, the positioning of a conductive pad may depend on the shape of the LED. In certain embodiments, one or more conductive pads can be positioned along one or more portions of the periphery of the emission surface of the light-emitting device. In one embodiment, conductive pads are positioned proximate one or more edges of the device (e.g., one or more edges of the emission surface of the device). In another embodiment, a conductive pad can be positioned near the center of the device. In yet another embodiment, conductive pads can be positioned parallel to one another, and/or substantially opposite one another, on a surface of the LED. An LED can also have any suitable number of conductive pads (e.g., 1, 2, or more conductive pads).

Conductive pads can be made of any suitable material. In some embodiments, a metal is used to form a conductive pad. Non-limiting examples of metals include gold, silver, platinum, copper, aluminum, nickel, titanium, tungsten, combinations thereof. Other metals or metal alloys, including transition elements from Groups 3-12 of the Periodic Table of Elements, can also be used. In some particular embodiments, a conductive pad may include a semi-conductive material.

As noted above, the light-emitting device can comprise electrically conductive pads disposed along portions of the periphery of the emission surface (e.g., along one or more edges of the emission surface). For example, in FIG. 4A, conductive pad 14A is positioned along a first portion of the periphery 609 of the emission surface of light-emitting device 600. In addition, conductive pads 14B, 14C, and 14D are positioned along second, third, and fourth portions of periphery 609 of the emission surface of light-emitting device 600. The portion of the periphery of the emission surface along which the conductive pad is disposed can correspond to an edge of the emission surface, in certain embodiments. For example, in FIG. 4A, the portion of periphery 609 along which conductive pad 14A is positioned corresponds to edge 601. In addition, conductive pad 14B is positioned along edge 603, conductive pad 14C is positioned along edge 602, and conductive pad 14D is positioned along edge 604.

In certain embodiments, electrically conductive pads (or portions thereof) can be opposed to each other. For example, in FIG. 4A, electrically conductive pad 14C is opposed to electrically conductive pad 14D. Two conductive pads (or portions thereof) are opposed, for example, when a straight line segment can be drawn that connects the conductive pads (or conductive pad portions) and intersects the geometric center of the emission surface.

In some embodiments, an electrically conductive bus bar can connect two or more of the conductive pads (or pad portions) by, for example, spanning at least a portion of the face of the LED (e.g., spanning at least about 50%, at least about 75%, at least about 90%, or substantially all of the face of the LED). In the set of embodiments illustrated in FIG. 4A, electrically conductive bus bar 606 electrically connects electrically conductive pad 14C to electrically conductive pad 14D. The conductive bus bar can be made of any suitable conductive material, including any of the materials used to form conductive pads 14A-D and/or contact members 20. For example, all or part of the bus bar(s) can be made of gold, silver, platinum, copper, aluminum, nickel, titanium, tungsten, combinations thereof, or other metals or metal alloys, including transition elements from Groups 3-12 of the Periodic Table of Elements. It can be advantageous, in some embodiments, to form the conductive bus bar(s) using the same materials as the conductive pads so that the bus bar(s) and pads can be manufactured using a single processing step.

Figure 4A:
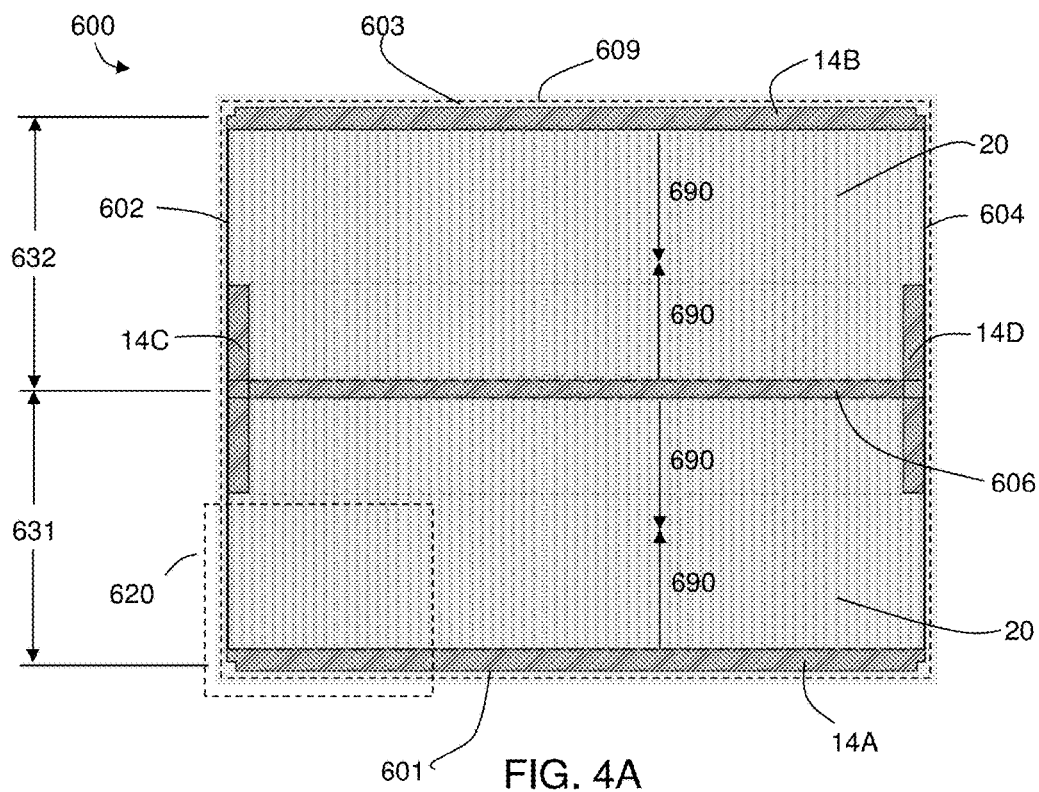
FIGS. 4A-4C show top views of an LED including a contact structure according to an embodiment of the invention.

The bus bar can include a conductive portion (e.g., including the exposed surface as illustrated in FIG. 4A) and a non-ohmic portion, which can be positioned underneath the conductive portion, for example, to maintain insulation between the bus bar and the surface of the LED.

In some embodiments, electrically conductive contact members are connected to and extend outward from the bus bar. For example, in FIG. 4A, electrically conductive contact members 20 are connected to and extend outward from electrically conductive bus bar 606.

The bus bar can have a length, which is defined by the first and second ends of the bus bar. In FIG. 4A, for example, the length of bus bar 606 extends from the point at which bus bar 606 contacts conductive pad 14C to the point at which bus bar 606 contacts conductive pad 14D. In FIG. 4A, bus bar 606 is substantially straight along its length. In other embodiments, the bus bar might be curved or angled along its length.

The electrically conductive contact members connected to bus bar 606 can also have lengths defined by first and second ends of the contact members. In FIG. 4A, the lengths of conductive members 20 extend from the point at which they contact bus bar 606 to points at which they connect conductive pads 14A or 14B. In FIG. 4A, contact members 20 are substantially straight along their lengths. In other embodiments, and as described in more detail elsewhere herein, contact members can be non-linear (e.g., angled and/or curved) along their lengths.

The electrically conductive contact members can contact the bus bar(s) to form any suitable smallest angle. One of ordinary skill in the art would recognize that when two components contact each other along a plane, the contact results in the formation of two angles within the plane at the contact point; the "smallest angle" corresponds to the smaller of the two angles formed at the contact point. The length of the bus bar and the lengths of the contact members connected to the bus bar can form, in certain embodiments, angles close to 90°. In certain embodiments, the electrically conductive contact members form smallest angles of at least about 75°, at least about 80°, at least about 85°, or at least about 88° with the length of the bus bar with which they are in contact. In certain embodiments, the electrically conductive contact members are substantially perpendicular to the bus bar. For example, in FIG. 4A, contact members 20 form smallest angles of substantially 90° with (i.e., they are substantially perpendicular to) bus bar 606.

In some embodiments, more than two conductive pads (or portions thereof) can be used to establish electrical contact along the emission surface of the light-emitting device. For example, in certain embodiments, a third electrically conductive contact pad (or portion of a contact pad) can be disposed along an edge of the emission surface (e.g., contact pad 14A along edge 601 in FIG. 4A). In some embodiments, a fourth electrically conductive contact pad (or portion of a contact pad) can be disposed along an edge of the emission surface (e.g., contact pad 14B along edge 602 in FIG. 4A). In certain embodiments, the third and fourth electrically conductive pads can oppose each other.

Figure 4B:
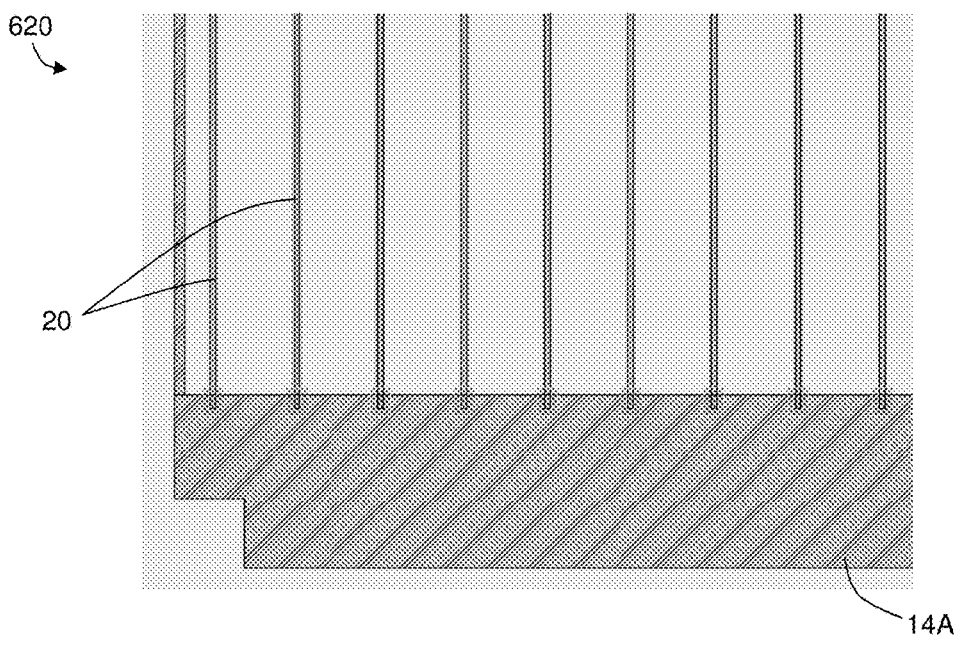

Contact members 20 can be arranged such that they extend from the bus bar to one or more conductive pads in the system. In certain embodiments, at least a portion of the contact members extending from the bus bar can connect the bus bar to the third contact pad. For example, in FIG. 4A, a portion of contact members 20 extend from bus bar 606 to conductive pad 14A. FIG. 4B is a schematic diagram of a magnified view of region 620 of light-emitting device 600, illustrating the connections between contact members 20 and contact pad 14A. In certain embodiments, at least a portion of the contact members extending from the bus bar can connect the bus bar to the fourth contact pad. In FIG. 4A, a portion of contact members 20 extend from bus bar 606 to conductive pad 14B.

Figure 4C:
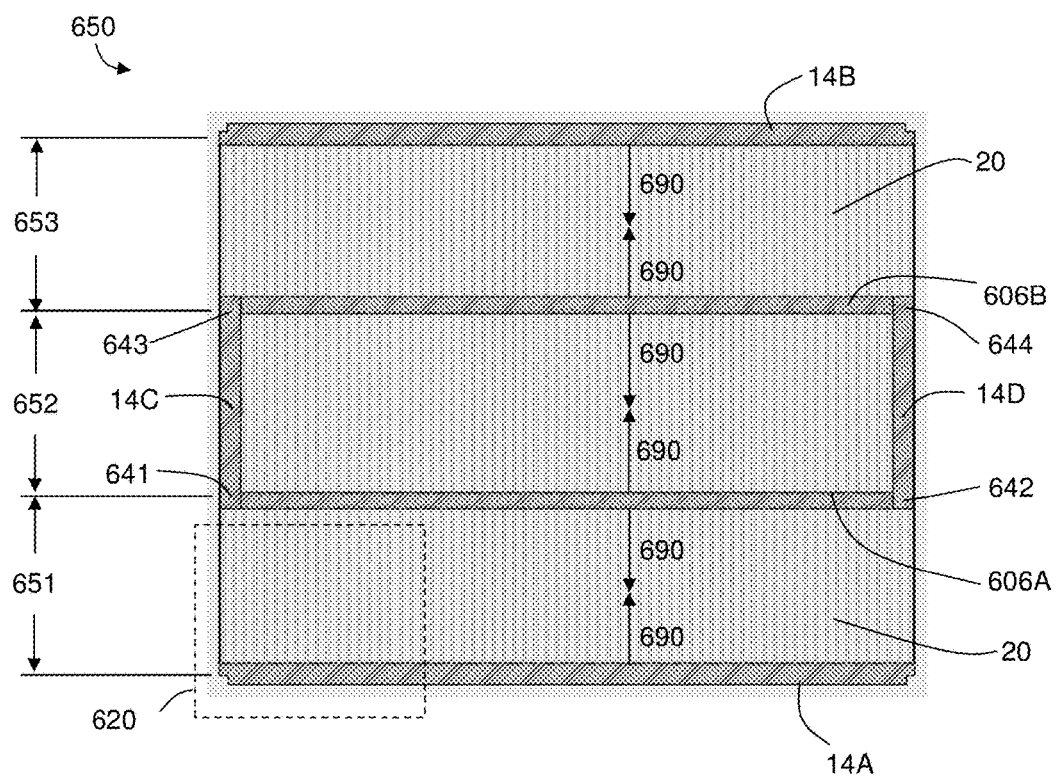

In some embodiments, the light-emitting device comprises multiple bus bars connecting first and second electrically conductive contact pads. In FIG. 4C, for example, LED 650 includes a first conductive bus bar 606A and a second conductive bus bar 606B. In FIG. 4C, each of conductive bus bars 606A and 606B connects conductive pad 14C to conductive pad 14D by spanning the surface of LED 650. In some embodiments, a first bus bar connects a first end of a first electrically conductive pad to a first end of the second electrically conductive pad, and a second bus bar connects a second end of the first electrically conductive pad to a second end of the second electrically conductive pad. In FIG. 4C, bus bar 606A connects first end 641 of contact pad 14C to first end 642 of contact pad 14D. In addition, bus bar 606B connects second end 643 of contact pad 14C to second end 644 of contact pad 14D.

A plurality of electrically conductive contact members can be connected to and extend outward from the second bus bar. In certain embodiments, at least a portion of the contact members can connect the second bus bar to one or more contact pads. For example, in FIG. 4C, second bus bar 606B is connected to contact pad 14B via contact members 20. In certain embodiments, the second bus bar can be connected to the first bus bar via contact members. In FIG. 4C, for example, first bus bar 606A is connected to second bus bar 606B via contact members 20. The lengths of contact members 20 can form any of the angles mentioned above with respect to the length of the first bus bar (e.g., smallest angles close to 90°) with the length of the second bus bar. For example, in FIG. 4C, the lengths of contact members 20 are substantially perpendicular to the length of second bus bar 606B.

The bus bars can be substantially equally spaced from each other and/or from conductive pads having lengths that run parallel (or substantially parallel) to the bus bars. For example, in FIG. 4A, the distance between bus bar 606 and conductive pad 14A (dimension 631) is substantially the same as the distance between bus bar 606 and conductive pad 14B (dimension 632), along the lengths of bus bar 606, pad 14A and pad 14B. In FIG. 4C, the distances between conductive pad 14A and bus bar 606A (dimension 651), between bus bar 606A and bus bar 606B (dimension 652), and between bus bar 606B and conductive pad 14B (dimension 653) are substantially the same along the lengths of pad 14A, bus bar 606A, bus bar 606B, and pad 14B.

Figure 5A:
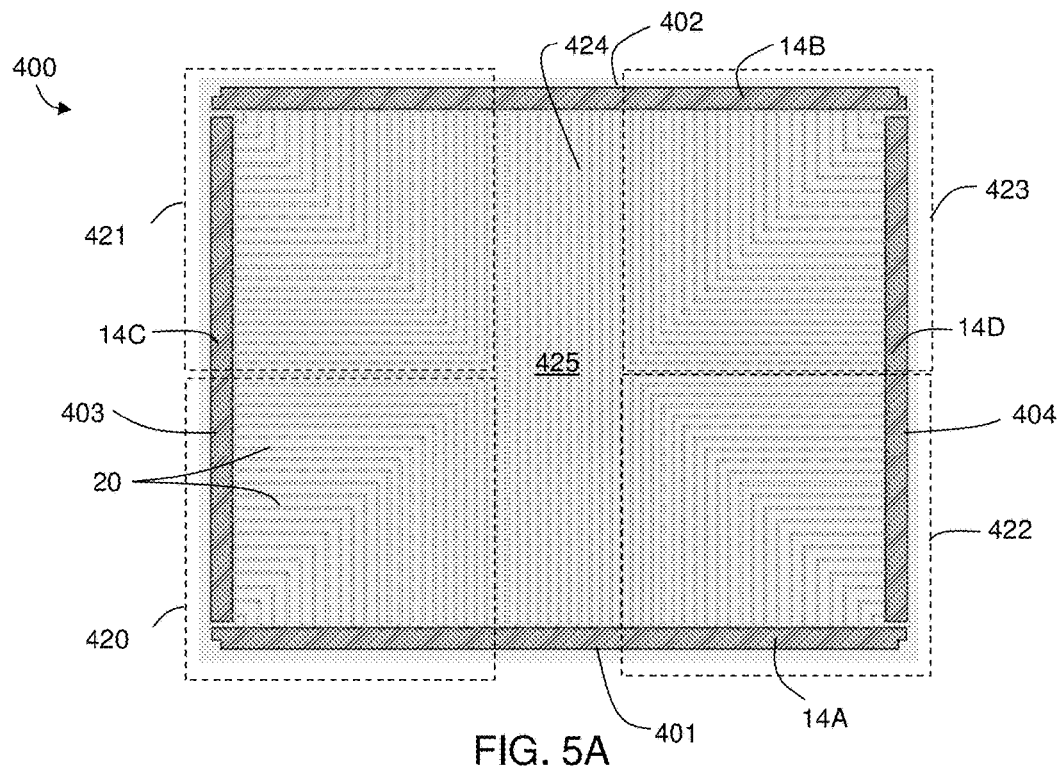
FIGS. 5A and 5B show top views of an LED including a contact structure according to an embodiment of the invention.
Figure 5B:
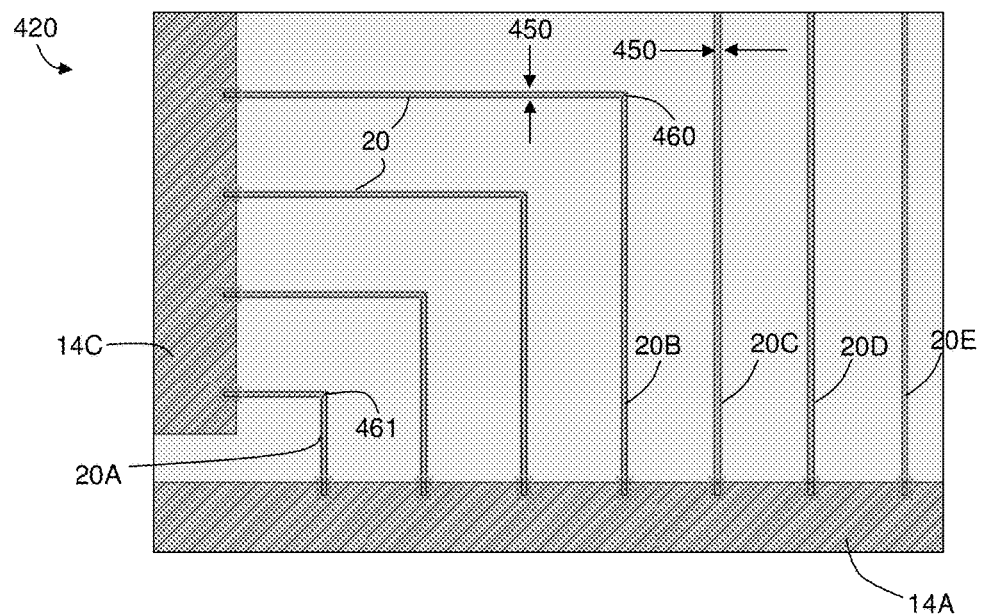

Other contact structures in which more than two conductive pads are used to establish electrical contact along the top surface of the light-emitting device are also possible. In certain embodiments, the contact portions can be arranged in a herringbone design. For example, FIG. 5A includes a schematic illustration of LED 400, which includes four conductive pads 14A, 14B, 14C, and 14D. In FIG. 5A, first electrically conductive pad 14A is disposed along edge 401 of the emission surface and second electrically conductive pad 14B, which is opposed to pad 14A, is disposed along edge 402 of the emission surface. In addition, third electrically conductive pad 14C is disposed along edge 403 of the emission surface and fourth electrically conductive pad 14D, which is opposed to pad 14C, is disposed along edge 404 of the emission surface. FIG. 5B includes a close-up view of section 420 of LED 400 in FIG. 5A.

In certain embodiments, a plurality of electrically conductive contact members are arranged such that they connect the first and third electrically conductive pads (e.g., pads 14A and 14C in FIG. 5A). In addition, a plurality of electrically conductive contact members can be arranged such that they connect the second and fourth electrically conductive pad portions (e.g., pads 14B and 14D in FIG. 5A). In some embodiments, electrically conductive contact members can be arranged such that they connect the first and fourth and/or second and third electrically conductive pads as well. In FIG. 5A, the contact members within region 420 connect conductive pads 14A and 14C, the contact members within region 421 connect conductive pads 14B and 14C, the contact members within region 422 connect conductive pads 14A and 14D, and the contact members within region 423 connect conductive pads 14B and 14D.

In certain embodiments, the electrically conductive contact members have first ends and second ends defining the lengths of the electrically conductive contact members, and the lengths of the electrically conductive contact members are non-linear.

The lengths of the electrically conductive contact members can be angled, in certain embodiments. For example, in FIG. 5A, light-emitting device 400 includes a plurality of contact members 20 with non-linear lengths that form substantially 90° angles. This results in contact members 20 forming a herringbone pattern within regions 420, 421, 422, and 423. The invention is not limited to contact members with lengths that form 90° angles, and in other embodiments, non-90° angles can be formed by the lengths of the contact members. In certain embodiments, the lengths of at least a portion of the electrically conductive contact members form at least one angle of between about 60° and about 120°, between about 75° and about 105°, between about 85° and about 95°, or between about 89° and about 91°.

The lengths of the contact members can be curved, in addition to or rather than being angled. In certain embodiments, the length of at least a portion of the contact members can form a substantial curve, as opposed to a slight curve that might be formed, for example, due to an imperfection in the fabrication process. In some embodiments, at least a portion of the contact members have lengths including a curved portion(s) with a radius of curvature that is less than about 50 times, less than about 10 times, less than about 5 times, or less than about 2 times the length of the contact member. In certain embodiments, the length of the contact member(s) can have a substantially constant radius of curvature (within any of the ranges noted above) along at least about 50% of its length, along at least about 75% of its length, along at least about 90% of its length, or along substantially all of its length.

In certain embodiments (including those in which contact members with non-linear lengths are employed, the lengths of some contact members can be longer than the lengths of other contact members. For example, in FIG. 5B, contact member 20A is shorter than contact member 20B. Variations in contact member length can produce variations in electrical resistances of the contact members, as longer structures are more resistant to the flow of electrical current in the length direction than are shorter structures, all other factors being equal. In some such embodiments, the widths and/or heights of the contact members can be varied, from contact member to contact member, in order to ensure relatively even distribution of current across the emission surface. For example, in FIG. 5B, light-emitting device 400 includes a first contact member 20A having a first length and a first width (and/or first height), and a second contact member 20B having a second length that is longer than the length of contact member 20A and a second width (and/or second height) that is wider (and/or taller) than the first width (and/or height). In some embodiments, the light-emitting device can comprise a third contact member with a third length that is longer than the second length and a third width and/or height that is wider and/or taller than the second width and/or height. A fourth contact member (e.g., 20C in FIG. 5B), a fifth contact member (e.g., 20D in FIG. 5B), a sixth contact member (e.g., 20E in FIG. 5B), etc. can also be present, each being progressively longer and each being progressively wider and/or taller. In certain embodiments, it can be advantageous to vary the widths of the contact members while maintaining substantially constant heights, for example, due to difficulties in varying the heights of contact members across the emission surface inherent in many fabrication methods.

In some embodiments, contact members that include portions located relatively close to the geometric center of the emission surface can be wider and/or taller than contact members including portions located relatively far away from the geometric center of the emission surface, which can reduce electrical resistance in regions close to the geometric center of the emission surface, and promote the flow of electrical current toward those regions. In FIG. 5B, the shortest distance between contact member 20B and the geometric center of the emission surface (i.e., the distance between point 460 and the geometric center of the emission surface) is shorter than the shortest distance between contact member 20A and the geometric center of the emission surface (i.e., the distance between point 461 and the geometric center of the emission surface). In some such embodiments, contact member 20B can be wider and/or taller than contact member 20A, which can promote the transport of current toward the geometric center of the emission surface. In some embodiments, a fourth contact member (e.g., 20C in FIG. 5B), a fifth contact member (e.g., 20D in FIG. 5B), a sixth contact member (e.g., 20E in FIG. 5B), etc. can also be present, each being progressively closer to the geometric center of the emission surface, and each being progressively wider and/or taller.

Referring back to FIG. 5A, light-emitting device 400 can also include optional, substantially straight contact members within portion 424, which connect conductive pads 14A and 14B.

By arranging the conductive pads and the contact members as described above, electrical current can be transferred toward central region 425 of LED 400, providing a more uniform current distribution across the top of the LED.

Figure 6A:
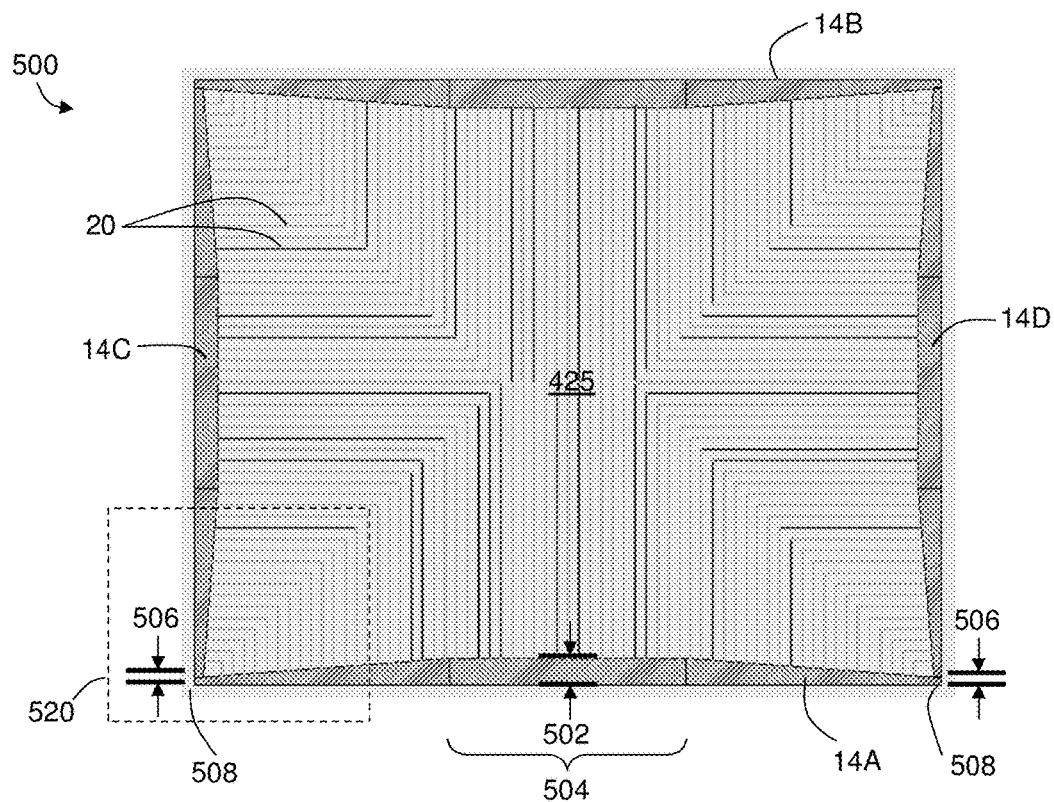
FIGS. 6A and 6B show top views of an LED including a contact structure according to an embodiment of the invention.
Figure 6B:
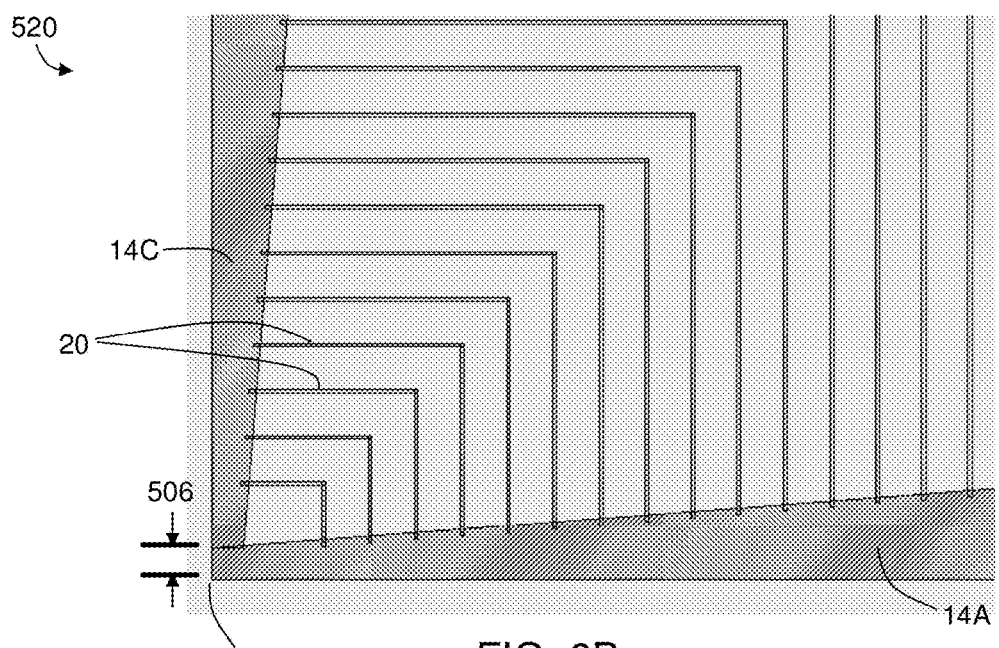

In some embodiments, the width of a conductive pad can be tapered such that it is relatively wide in one portion (e.g., at the middle) and relatively narrow in another (e.g., at the ends). For example, in FIGS. 6A-6B, LED 500 includes tapered conductive pads 14A, 14B, 14C, and 14D. FIG. 6B includes a close-up view of section 520 of LED 500 in FIG. 6A. Each of the conductive pads in FIG. 6A is wider toward the middle, relative to the widths at the ends of the pads (i.e., near the corners of the LED). For example, conductive pad 14A has a first width 502 along central region 504 and a second, smaller width 506 at edge regions 508. The use of conductive pads with tapered widths can allow relatively more current to be transported to central region 425 of the LED.

While tapering of conductive pads has been illustrated with respect to the embodiments shown in FIGS. 6A-6B, it should be understood that any of the conductive pads described herein, including the conductive pads in FIGS. 4A-4C, 5A-5B, and FIGS. 7A-7D) may be tapered. In addition, any of the bus bars described herein (e.g., bus bar 606, 606A, and/or 606B) may be tapered.

The taper of the conductive pads and/or bus bars can be linear or non-linear. In addition, any suitable variation in taper can be employed. In some embodiments, the width of the conductive pad and/or bus bar at its widest point (e.g., dimension 502 in FIG. 6A) can be at least 1.1, at least about 1.5, at least about 2, between about 1.1 and about 10, between about 1.1 and about 5, between about 1.1 and about 4, or between about 1.1 and about 3 times the width of the conductive pad and/or bus bar at its narrowest point (e.g., dimension 506 in FIGS. 6A-6B).

While FIGS. 5A-5B and 6A-6B include conductive pads that span a relatively large portion of the length of the edge of the LED, in other embodiments, one or more conductive pads can be arranged such that they span only a relatively small portion of the length of the edge of the LED. FIGS. 4A and 4B (which includes a close-up view of section 620 of LED 600 in FIG. 4A) include an illustration of one such embodiment. In FIG. 4A, conductive pads 14C and 14D span only about ⅓ of the lengths of edges 602 and 604 (along which pads 14C and 14D, respectively, are disposed). In some embodiments, one or more conductive pads can span less than about 90%, less than about 75%, less than about 50%, less than about 35%, between about 10% and about 90%, between about 20% and about 50%, between about 25% and about 40%, or between about 30% and about 35% of the length of the edge of the LED along which the conductive pad is disposed.

Figure 3:
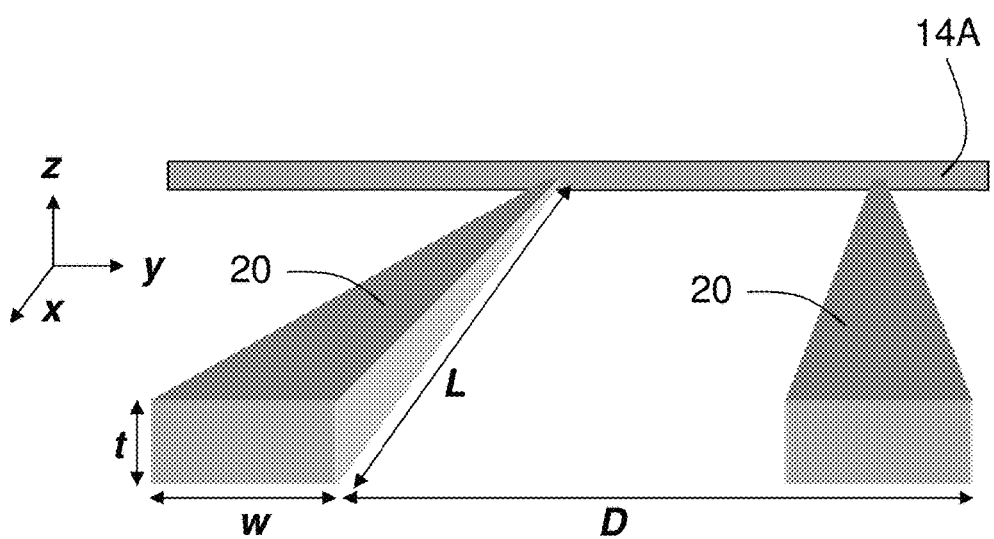
FIG. 3 shows a side perspective view of a contact structure according to an embodiment of the invention.

In general, contact members can be designed to have a desired shape and dimension. Contact members include electrically conductive portions and may also include a non-ohmic portion. As shown in FIG. 3, a device may include contact members 20 that extend from conductive pad 14. The contact members may include a length, L, a width, w, and a height, t. As illustrated in FIG. 3, contact members 20 may have substantially similar dimensions. In other embodiments, however, contact members of a device may have substantially different dimensions relative to one another, as described elsewhere herein. The spacing between adjacent contact members, or the periodicity of the contact members, D, may be the same amongst a contact structure of a device. However, the periodicity may vary across a contact structure in some designs.

In some embodiments, contact structures of the invention may include a conductive portion, and the structure can have a contact resistance that varies along a length of the conductive portion. For instance, the contact resistance may vary from a first end to a second end of the conductive portion, the first and/or second ends being in connection (e.g., electrical contact) with one or more conductive pads. In certain embodiments, a contact member can be configured such that its contact resistance decreases (e.g., linearly or non-linearly) along the length of the contact member as a function of distance from a conductive pad and/or bus bar. The variation in contact resistance may be caused by one or more factors such as the shape of the conductive portion and/or non-ohmic portion, the material composition of the conductive portion and/or the non-ohmic portion, and/or the positioning of the conductive portion relative to the non-ohmic portion.

It should be understood that in some embodiments, contact members (including conductive portions and/or non-ohmic portions) having a contact resistance that varies may have a shape defined by a linear taper. For example, the contact member may be substantially triangular in shape. In other embodiments, contact members may be non-tapered, e.g., they may be substantially rectangular in shape. Advantageously, the variation in contact resistance of a contact structure can promote current flow (e.g., towards the ends of the contact members) to increase current spreading across a top surface of a device. This can cause reduction in current crowding, greater uniformity of light emission, and/or can improve performance in a device.

In some embodiments, the portions of contact members 20 that are relatively close to the central region of the LED (e.g., central region 425 in FIG. 5A) can be wider than the portions of the contact members located closer to the edges (e.g., edges 601, 602, 603, and 604 in FIG. 4A) of the LED. Widths of exemplary contact members 20 are indicated by dimensions 450 in FIG. 5B. In some embodiments, the width of the contact member at its widest point can be at least 1.1, at least about 1.5, at least about 2, between about 1.1 and about 5, between about 1.1 and about 4, or between about 1.1 and about 3 times the width of the contact member at its narrowest point. In some embodiments, the widest portions of the contact members lie at the point of the contact member that is closest to the geometric center of the top surface of the LED. In some embodiments, the largest width of any contact member lies within a maximum distance from the geometric center of the top surface of the LED. For example, in some embodiments, the distance between the geometric center of the LED surface and the widest portion of any contact member is less than about 0.5, less than about 0.25, or less than about 0.1 times the maximum edge length of the LED.

The conductive portions of the contact members may have a constant periodicity (e.g., the spacing between each of the conductive portions may be substantially equal). Sometimes, however, the conductive portions of the contact members may be unequally spaced relative to one another. Despite unequal spacing of conductive portions, the areas of contact between the conductive and non-ohmic portions may be substantially equal for each, or a majority, of the conductive portions.

The number of contact members in contact structures of the invention can vary, e.g., depending on the dimensions of the device, the dimensions and/or arrangement of the contact members, and/or the amount of power supplied to the device. The number of non-ohmic portions relative to conductive portions can also vary, e.g., depending on the arrangement of non-ohmic and conductive portions on the device.

Figure 7A:
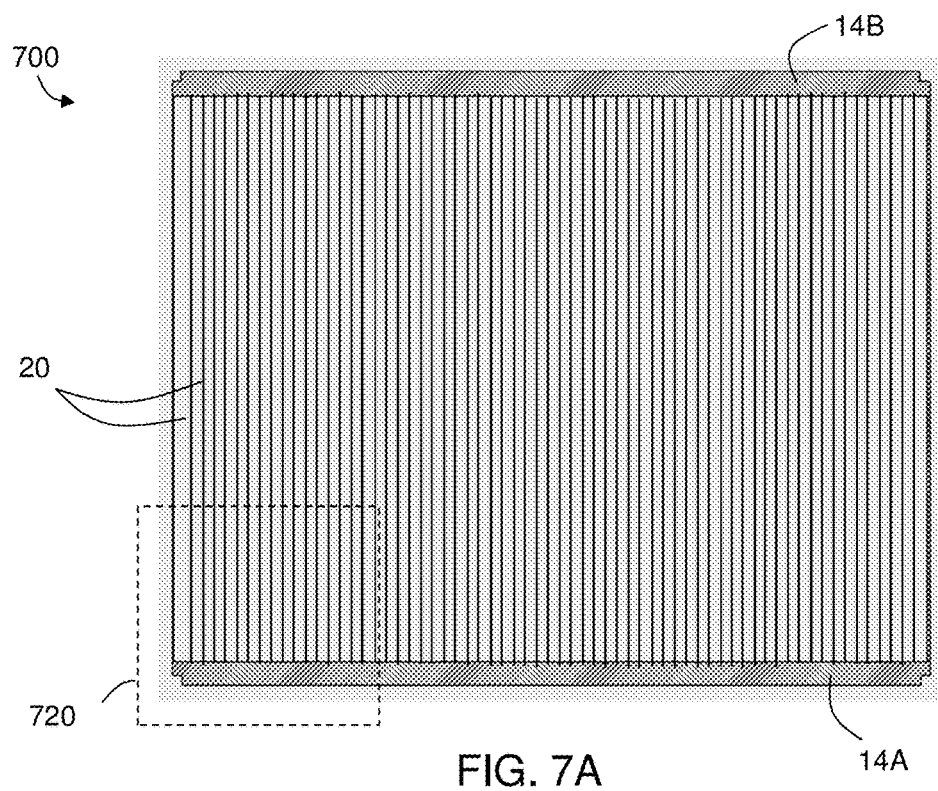
FIGS. 7A-7D show schematic illustrations of an LED including a contact structure including one arrangement of conductive and non-ohmic portions according to an embodiment of the invention.
Figure 7B:
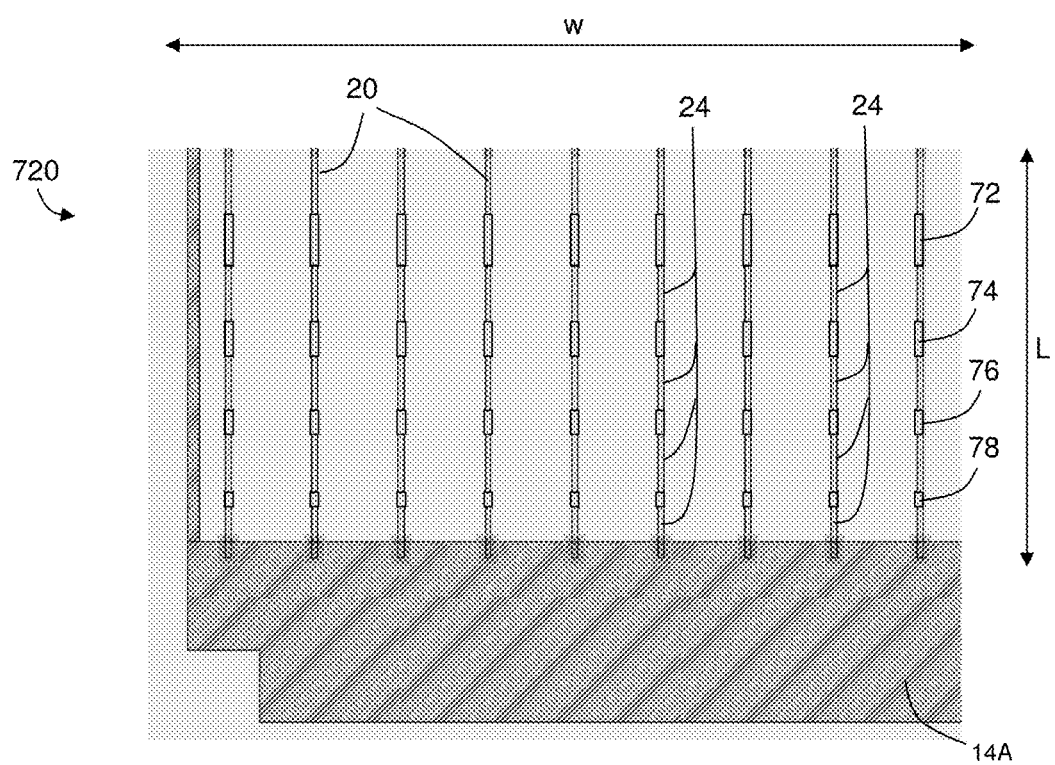
Figure 7C:
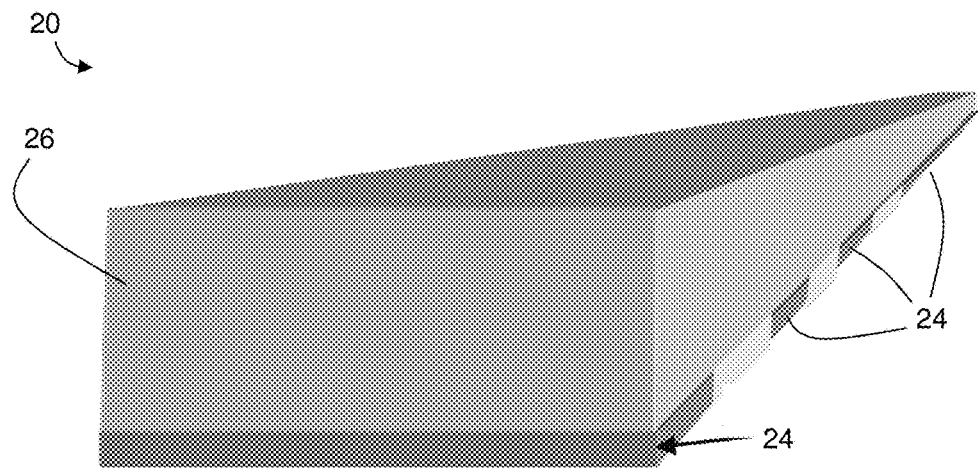
Figure 7D:
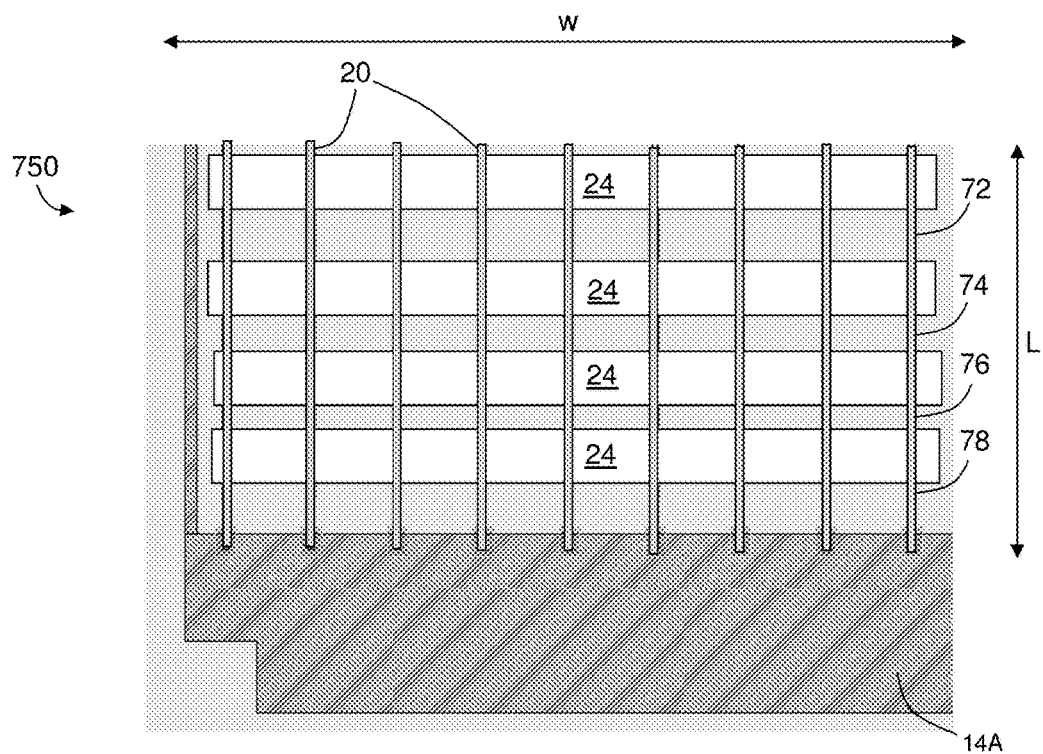

In some embodiments, the LED can include multiple conductive portions disposed on more than one non-ohmic portions, which are discontinuous along a length of a contact member. FIGS. 7A-7B show top views of an LED 700, including contact members 20 extending from conductive pads 14A and 14B. FIG. 7B is a close up view of region 720 in FIG. 7A. Each of contact members 20 includes a conductive portion 26 (shown in FIG. 7C, but omitted from FIG. 7B for purposes of clarity) and non-ohmic portions 24 disposed underneath the conductive portion at various regions along the lengths L of the contact members. As illustrated in FIG. 7B, the non-ohmic portions are discontinuous along the length L. FIG. 7C shows a side view of contact member 20. In FIG. 7B, the respective spacings of successive non-ohmic portions increases along the length of the conductive portion. For instance, spacing 72 is greater than spacing 74, spacing 74 is greater than spacing 76, and spacing 76 is greater than spacing 78. In some embodiments, this arrangement can create a non-linear variation of contact resistance along the length of the contact member. Accordingly, current flowing from the conductive pad may be distributed substantially uniformly to the top surface of the device along the lengths of the contact members.

The widths of the non-ohmic portions of a contact structure may be the same, e.g., as shown in FIG. 7B; however, in some cases, the widths may differ. For instance, the widths of successive non-ohmic portions may increase along the length of the conductive portion.

As illustrated in the embodiments of FIGS. 7A-7D, non-ohmic portions are substantially parallel to one another and positioned substantially perpendicular to the conductive portions. Similarly in FIGS. 7A-7D, conductive portions are substantially parallel to one another. In other embodiments, however, non-ohmic portions can be positioned at different angles relative to one another and/or relative to the conductive portions, and the same may apply to the conductive portions. For instance, some of the non-ohmic portions of a contact structure may be parallel to one another, and other non-ohmic portions of the contact structure may be positioned at one or more angles, e.g., 30°, 45°, 60°, or 75°, relative to one another. As such, some or all of the non-ohmic portions may be positioned at different angles relative to the conductive portions.

Also illustrated in the embodiments of FIGS. 7A-7C are non-ohmic portions 24 that are discontinuous across successive conductive portions in the width direction w. In other embodiments, contact structures can include a non-ohmic layer that extends across the width of the contact structure. For example, in FIG. 7D, non-ohmic portions 24 extend across the width of LED 750.

Contact members, including conductive portions and non-ohmic portions, may have any suitable dimension. For instance, the length of a conductive portion of a contact member can range from 10 µm to 500 µm (e.g., between 10 µm and 200 µm, between 200 µm and 350 µm, or between 350 µm and 500 µm). The width of a conductive portion of a contact member can range, for example, from 0.1 µm to 50 µm (e.g., between 0.1 and 10 µm, between 1 µm and 20 µm, between 20 µm and 30 µm, or between 30 µm and 50 µm). The height of the conductive and/or non-ohmic portions can vary based on, for example, current and power to be supplied to the LED, or based on deposition and processing parameters. For example, conductive and/or non-ohmic portions can have a height ranging from 0.1 µm to 100 µm (e.g., between 0.1 µm and 1 µm, between 1 µm and 10 µm, or between 10 µm and 100 µm).

In certain embodiments, the width and/or height of the contact members are substantially smaller than the widths and/or heights of the contact pad(s) and/or bus bar(s) within the contact structure. For example, in certain embodiments, the contact pad(s) and/or bus bar(s) within a contact structure can have widths and/or heights that are at least 2 times, at least 5 times, or at least 10 times (and/or up to 1000 times or up to 100 times) greater than the widths and/or heights of the contact member(s) within the contact structure. The use of relatively wide and/or tall contact pads and bus bars can ensure rapid transport of electrical current to edges and/or through central distribution pathways, while the use of relatively narrow contact members can distribute current while minimizing the degree to which light is blocked or otherwise inhibited from being emitted from the emission surface.

Conductive portions of contact members can be made of any suitable material. In some embodiments, a metal is used to form a conductive portion. Non-limiting examples of metals include gold, silver, platinum, copper, aluminum, nickel, titanium, tungsten, combinations thereof. Other metals or metal alloys, including transition elements from Groups 3-12 of the Periodic Table of Elements, can also be used. In other embodiments, a conductive portion may include a semi-conductive material. Sometimes, a conductive portion of a contact member can be formed of the same material as a conductive pad.

In some embodiments, the composition of materials used to form the conductive portions of the contact members can cause the contact resistance to vary (e.g., non-linearly) as a function of length of the contact member. For example, a conductive portion may be formed of a conductive material and may include a dopant having a lower conductivity (i.e., higher resistivity) than that of the conductive material. The dopant may be integrated into the conductive material so as to form a non-linear concentration gradient of the dopant along a length of the contact member. In some cases, such a composition can cause the contact resistance to vary non-linearly in the contact member.

Impurities may include any suitable material including metals, semi-conductors, and insulators. A suitable dopant may depend on, e.g., the composition of the conductive portion, the compatibility of the dopant with the material used to form the conductive portion, and/or deposition and processing parameters.

Non-ohmic portions can be formed of any suitable material. The non-ohmic portion may have a lower conductivity (i.e., higher resistivity) than that of the conductive portion. In some cases, non-ohmic portions may include insulators such as oxides and nitrides (e.g., silicon oxide and silicon nitride). In other cases, non-ohmic portions may include Schottky metals (i.e., Schottky contact materials). Suitable Schottky metals may depend on the material used to form the conductive layer and/or the particular material used to form the top surface of the device (e.g., the n-doped layer). For example, a top surface formed of GaN may include contact members with non-ohmic portions comprising indium-tin oxide (ITO). In another example, a layered stack of metals could be used to form a Schottky contact containing combinations of Ti, Pt, Au, Cu, and/or Pd.

In some cases, it may be desirable for particular arrangements of the non-ohmic and/or conductive portions to have contact structures made in certain materials. For instance, certain arrangements of conductive and non-ohmic portions may allow increased current distribution across the top surface of the device, while also increasing light output from the top surface. For example, in some embodiments involving the use of an opaque Schottky metal as the non-ohmic portion of a contact member, the number of conductive portions may be the same as the number of non-ohmic portions. E.g., each conductive portion may be in contact (e.g., aligned) with a non-ohmic portion. This arrangement may minimize the amount of the top surface covered by the opaque non-ohmic layer. In embodiments involving the use of a transparent Schottky metal (e.g., ITO) as the non-ohmic portion, the number of non-ohmic portions may be greater than the number conductive portions. In this embodiment, the non-ohmic portions may not hinder the light output from the surface of the LED, and, therefore, the non-ohmic portions lying outside of the contact members may not be a concern.

In some cases, a variation in contact resistance of a contact structure may be caused by a combination of factors such as the shape and material composition of the conductive portion and/or non-ohmic portion, or the shapes of both the conductive and non-ohmic portions. As such, light-emitting devices may include one or more combinations of embodiments described herein.

While a variation in contact resistance has been primarily described with respect to FIGS. 7A-7D, it should be understood that contact members having varying contact resistances along their lengths could also be employed in other embodiments. In some such embodiments, the contact member (or multiple members) can be configured such that its contact resistance decreases (e.g., linearly or non-linearly) along the length of the contact member as a function of distance from a conductive pad and/or bus bar. For example, in FIGS. 4A and 4C, contact members 20 can be configured such that their contact resistances decrease in the directions of arrows 690. Optionally, contact members 20 can have a minimum contact resistance near the midpoint of the contact member (e.g., the points where the heads of arrows 690 meet).

U.S. Patent Publication No. 2005/0051785 to Erchak et al., based on U.S. patent application Ser. No. 10/871,877, filed on Jun. 18, 2004, and entitled "Electronic Device Contact Structures"; and U.S. Pat. No. 7,598,531 to Erchak et al., based on U.S. patent application Ser. No. 11/357,743, filed on Feb. 17, 2006 and entitled "Electronic Device Contact Structures" are each incorporated hereby reference in their entireties. U.S. Provisional Patent Application Ser. No. 61/475,715, filed Apr. 15, 2011, and entitled "Electronic Device Contact Structures," is also incorporated herein by reference in its entirety for all purposes.

While several embodiments of the present invention have been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present invention. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings of the present invention is/are used. Those skilled in the art will recognize, or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described and claimed. The present invention is directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the scope of the present invention.

The invention claimed is:

1. A light-emitting device, comprising:
   an emission surface bound by a periphery;
   a first electrically conductive pad layer disposed along a first portion of the periphery of the emission surface;
   a second electrically conductive pad layer disposed along a second portion of the periphery of the emission surface and opposed to the first electrically conductive pad layer;
   a third electrically conductive pad layer disposed along a third portion of the periphery of the emission surface;
   a fourth electrically conductive pad layer disposed along a fourth portion of the periphery of the emission surface and opposed to the third electrically conductive pad layer;
   a plurality of electrically conductive contact members connecting the first and third electrically conductive pad layers; and
   a plurality of electrically conductive contact members connecting the second and fourth electrically conductive pad layers,
   wherein the electrically conductive contact members have first ends and second ends defining lengths of the electrically conductive contact members, and the lengths of the electrically conductive contact members are non-linear.

2. The light-emitting device of claim 1, wherein the lengths of at least a portion of the electrically conductive contact members form at least one angle of between about 60° and about 120°.

3. The light-emitting device of claim 1, wherein the lengths of at least a portion of the electrically conductive contact members are curved.

4. The light-emitting device of claim 1, comprising:
   a first contact member having a first length and a first width and a first height, and
   a second contact member comprising:
      a second length that is longer than the first length, and
      a second width that is wider than the first width and/or
      a second height that is taller than the first height.

5. The light-emitting device of claim 4, comprising;
   a third contact member with a third length that is longer than the second length, and
   a third width that is wider than the second width and/or a third height that is taller than the second height.

6. The light-emitting device of claim 1, comprising:
   a first contact member having a non-linear length, and
   a second contact member having a non-linear length, wherein
   the shortest distance between the first contact member and the geometric center of the emission surface is shorter than the shortest distance between the second contact member and the geometric center of the emission surface, and
   the width of the first contact member is greater than the width of the second contact member and/or the height of the first contact member is greater than the height of the second contact member.

7. The light-emitting device of claim 1, wherein the light-emitting device comprises a light-emitting diode.

* * * * *